(12) United States Patent
Venkatesh et al.

(10) Patent No.: US 6,201,747 B1
(45) Date of Patent: Mar. 13, 2001

(54) METHOD AND APPARATUS FOR MEASURING SUBTHRESHOLD CURRENT IN A MEMORY ARRAY

(75) Inventors: Bhimachar Venkatesh, Cupertino; Vikram S. Santurkar, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/409,542

(22) Filed: Sep. 30, 1999

(51) Int. Cl.[7] ..................................................... G11C 7/00
(52) U.S. Cl. ................ 365/201; 365/185.24; 365/189.08
(58) Field of Search .............................. 365/201, 185.24, 365/230.06, 185.23, 189.08

(56) References Cited

U.S. PATENT DOCUMENTS 5,706,235 * 1/1998 Roohparvar et al. ................. 365/201
5,732,022 * 3/1998 Kato et al. ....................... 365/185.24
5,790,459 * 8/1998 Roohparvar ..................... 365/185.21
5,930,188 * 7/1999 Roohparvar ........................... 365/201
5,956,277 * 9/1999 Roohparvar ........................... 365/201

* cited by examiner

*Primary Examiner*—David Nelms
*Assistant Examiner*—Thong Le
(74) *Attorney, Agent, or Firm*—Brinks Hofer Gilson & Lione

(57) ABSTRACT

An integrated circuit (100) includes an array of memory cells (102), each memory cell coupled to a word line (220, 222, 224) and a bit line (226). The integrated circuit further includes a first external connection (202) configured to receive a variable voltage and a second external connection (210) configured to provide an operating parameter of the integrated circuit. First logic circuitry (204) is coupled to the first external connection and word lines of the array of memory cells and is configurable in one of a normal mode and a test mode in response to a first control signal. The first logic circuitry conveys the variable voltage to the array in the test mode.

15 Claims, 3 Drawing Sheets

METHOD AND APPARATUS FOR MEASURING SUBTHRESHOLD CURRENT IN A MEMORY ARRAY

BACKGROUND OF THE INVENTION

The present invention relates generally to testing of integrated circuits. More particularly, the present invention relates to a method and apparatus for measuring subthreshold current in a memory array.

There is a need to test the operation of memory cells in a memory device. Operation is related to the performance (reading, erasing, writing) of memory cells and to the consistent operation of memory cells. By testing operation of a cell or a group of cells, the design of a memory device can be characterized and improved.

One example occurs in a flash memory configured as a memory cell array of 512 word lines by 1024 or more columns or bit lines. A single row or word line is selected by address decoding circuitry. When selected, the word line is at a voltage near $V_{cc}$, the positive supply voltage of the integrated circuit. Deselected word lines remain near ground potential.

In this condition, the unselected cells may draw substantial current. Subthreshold or leakage current is undesirable and occurs for example, because of an over erase condition of the memory cell. Further, subthreshold current occurs because of variation in threshold voltage ($V_t$) of the transistors in the memory cells. While the subthreshold current in an individual memory cell is small, on the order of 100 nA, in a large memory, the subthreshold current in an entire column of memory cells may total 1–3 µA. This is substantial compared to the read current in a memory cell required to activate a sense amplifier to read the state of the selected cell. Characterization of the subthreshold current allows determination of the portion of current in the sense amplifier due to subthreshold current.

Previously, subthreshold current has been characterized using a test structure on an integrated circuit. The test structure has, for example, 512 memory cells arranged in a column with terminals for applying and reading voltages and other signals. While this is effective at obtaining data, this setup has some limitations. An actual integrated circuit does not always behave the same way as a test structure. For example, a bit line in a sector of the memory cell array with a slow bit behaves differently from a normal bit line in another sector. Moreover, the prior art setup took as much as a week for full collection of data. The prior art testing technique only permits indirect measurement of data rather than measurement of data in an actual memory product.

Accordingly, there is a need for an improved method and apparatus for testing memory devices.

BRIEF SUMMARY OF THE INVENTION

By way of introduction only, an integrated circuit in accordance with the present invention includes a test mode for measuring subthreshold current in a memory array. In this mode, a supply voltage that varies from 0 to 1 volt in one embodiment is applied to control gates of the memory cell array from an external input/output pad. The bit lines of the array are decoded and electrically coupled to another external input/output pad. In this manner, the bit line current can be measured. Operating parameters such as temperature and supply voltage can be varied to fully characterize the device. In this manner, the test measurements are taken directly from the memory device, rather than from a separate test chip.

DETAILED DESCRIPTION OF THE PRESENTLY PREFERRED EMBODIMENTS

Figure 1:
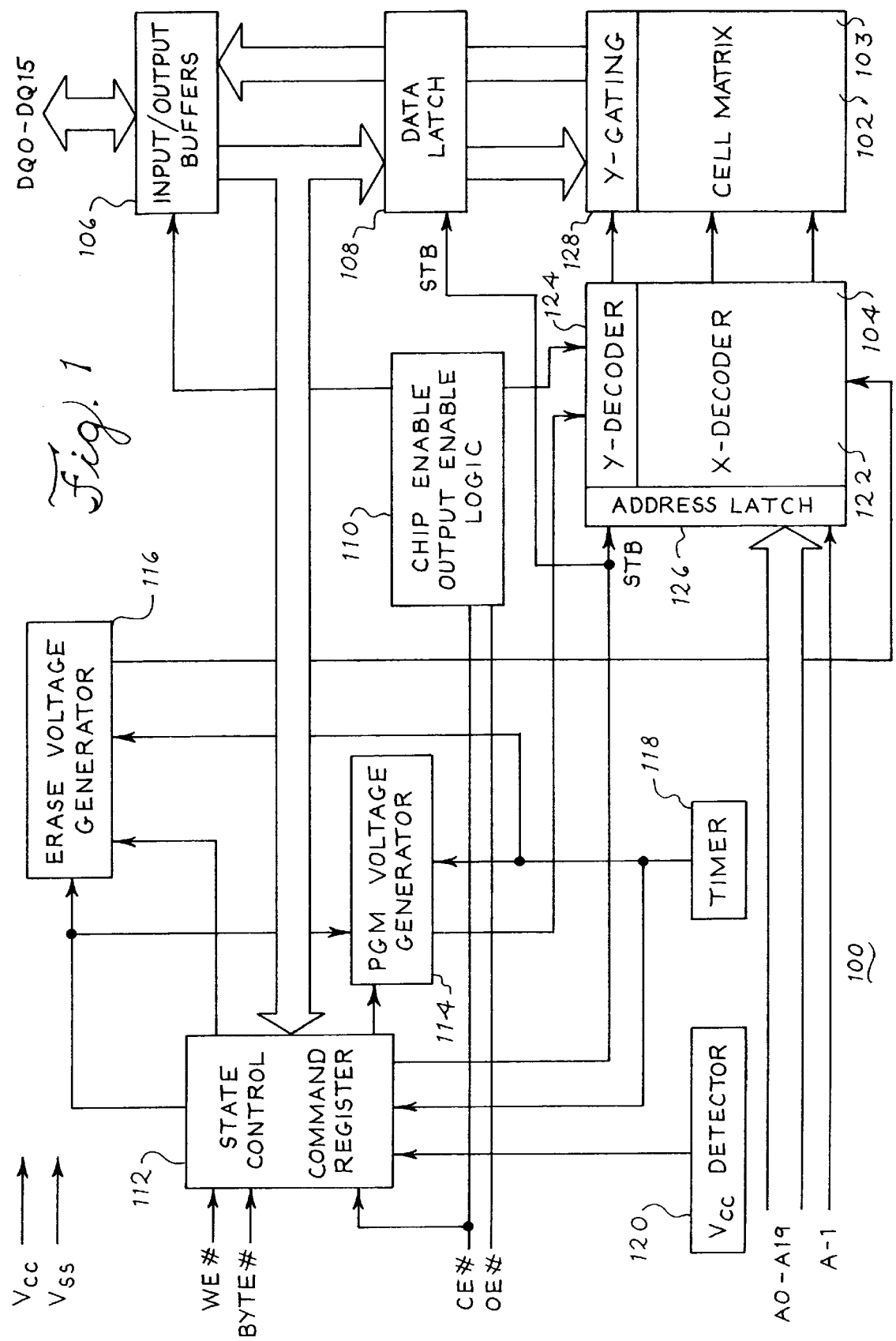
FIG. 1 is a block diagram of an integrated circuit.

Referring now to the drawing, FIG. 1 is a block diagram of an integrated circuit 100. In the illustrated embodiment, the integrated circuit 100 is a flash memory. However, other types of integrated circuits may embody the present invention. For example, the integrated circuit 100 may be a logic circuit, gate array or other type of integrated circuit with embedded memory. Any type of integrated circuit which includes a memory circuit and input/output pads for external signal transfer may be suitable.

The integrated circuit 100 includes a memory cell array 102, an address decoder 104, input/output (I/O) buffers 106, and a data latch 108. The integrated circuit 100 further includes enable logic 110, state control logic 112, a program voltage generator 114, an erase voltage generator 116, a timer 118 and a $V_{cc}$ detector 120. The integrated circuit 100 operates using two supply voltages, $V_{cc}$, which is typically 1.8 volts, and $V_{ss}$, which is typically at ground potential.

The integrated circuit 100 includes a plurality of input/output pads for external transfer of data and other signals. These are labelled around the periphery of the exemplary embodiment of FIG. 1. They include address inputs labelled A0–A19, output enable and chip enable inputs labelled OE# and CE#, and bidirectional data pads labelled DQ0–DQ15. Such input/output pads may be constructed using suitable circuitry such as electrostatic discharge (ESD) protection on inputs and voltage and current drivers on outputs. Design and placement of such input/output pads is well known to those ordinarily skilled in the art.

The memory cell array 102 includes a cell matrix 103 containing a plurality of memory cells and a Y-gating block 128. Each memory cell stores a single bit of data. Each memory cell is located at the intersection of a row or word line and a column and bit line. In an exemplary embodiment, the memory cell array 102 includes 512 rows by 1024 columns. Each individual memory cell is independently addressable using the address decoder 104. In different applications, the memory cell array 102 may be divided into different sectors or banks in order to increase the performance or flexibility of the integrated circuit 100.

The address decoder 104 includes an X decoder 122 and a Y decoder 124, along with an address latch 126. The address decoder 104 receives address data from I/O pads labeled A0–A19. These I/O pads are configured as bonding pads at the perimeter of the integrated circuit 100. The address latch 126 latches the address data for use by the X decoder and the Y decoder. The X decoder 122 decodes the address data to select a single row of the memory cell array 102. The X decoder selects a row by changing the voltage of the selected row from an unselected voltage to a selected voltage. In one embodiment, the unselected voltage is $V_{ss}$ and the selected voltage is approximately $V_{cc}$. The Y decoder 124 responds to the address data by selecting one or more columns of the memory cell array for reading or writing data in the memory cell array 102. The Y-decoder 124 selects a column by passing a signal to the Y-gating block 128 of the memory cell array 102.

The input/output buffers 106 are connected to I/O pads labeled DQ0–DQ15 for communicating data into and out of the integrated circuit 100. The input/output buffers 106 are bidirectional, both conveying data to the data latch 108 for storage in the memory cell 102 and conveying data from the data latch 108 which has been read from the memory cell array 102. The enable logic 110 responds to chip enable and output enable signals at I/O pads of the integrated circuit 100 for activating portions of the integrated circuit 100.

The state control logic 112 controls the active state of the integrated circuit 100. As a flash memory, the integrated circuit 100 is able to read, write and erase data at individual locations of the memory cell array 102. In response to data received at I/O pads of the integrated circuit 100, including a write enable signal, a byte signal and the chip enable signal the state control logic controls other portions of the integrated circuit 100 to place those portions in the proper mode. Other operational modes for the integrated circuit 100 include a test mode, as will be described in further detail below in conjunction with FIG. 2.

The program voltage generator 114 generates a voltage sufficient to program the selected cell in the memory cell array 102 to the selected data. The erase voltage generator 116 generates a voltage sufficient to erase the selected memory cell in the memory cell array. The timer 118 controls timing of various processes in the integrated circuit 118. The $V_{cc}$ detector 120 detects the presence and value of $V_{cc}$, the supply voltage provided to the integrated circuit 100.

Figure 2:
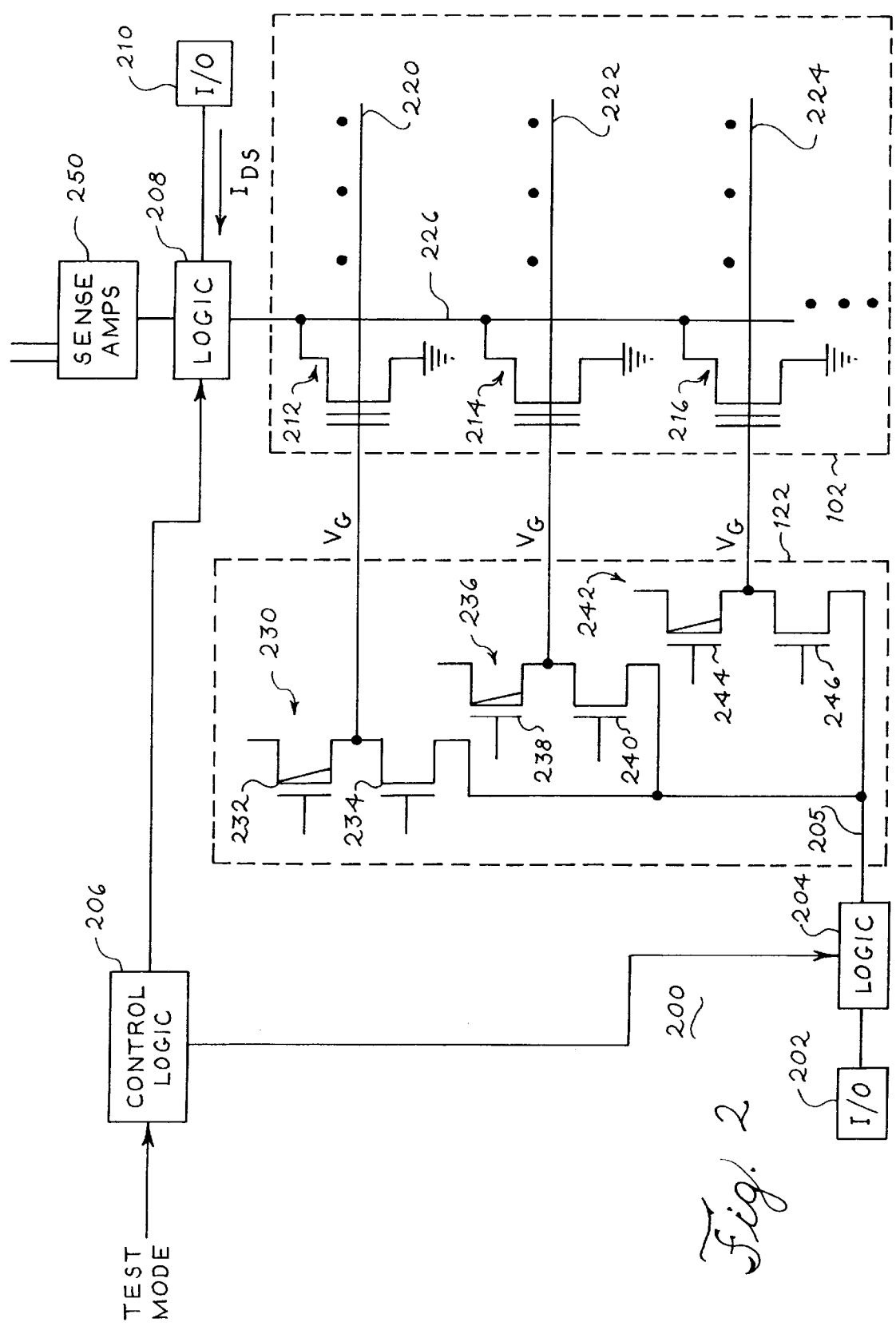
FIG. 2 is a block diagram of a portion of the integrated circuit of FIG. 1 illustrating a test mode of operation of the integrated circuit.

FIG. 2 is a block diagram illustrating a portion 200 of integrated circuit 100 of FIG. 1. FIG. 2 illustrates operation of the integrated circuit 100 in a test mode. In test mode, operation of the integrated circuit 100 may be characterized in detail. This characterization is not available when operating in the normal mode. In normal mode, operation is generally limited to reading, erasing and writing data in the memory cell array. Test mode may be entered in any suitable manner, such as by applying appropriate voltages to various inputs of the integrated circuit 100.

For operation in the test mode, the portion 200 of the integrated circuit includes a first I/O pad 202, first logic circuitry 204, control logic 206, second logic circuitry 208 and a second I/O pad 210. FIG. 2 also illustrates a portion of the memory cell array 102, the X decoder 122 and the Y-gating 128.

The first I/O pad 202 and the second I/O pad 210 may be any of the I/O pads of the integrated circuit 100. More generally, the I/O pads 202, 210 can be replaced by any suitable external connection, such as a probe point or bonding pad, which allows an external voltage to be applied and a current detected.

The memory cell array 102 includes a plurality of memory cells such as first memory cell 212, second memory cell 214 and third memory cell 216. In the illustrated embodiment, each memory cell includes a single transistor having a floating gate for storing charge and retaining the data stored in the memory cell. Such types of memory cell are well known in the art. Each memory cell is coupled to a word line and a bit line. Thus, the first memory cell 212 is coupled to a first word line 220, the second memory cell 214 is coupled to a second word line 222 and the third memory cell 216 is coupled to a third word line 224. Each of these three memory cells is commonly connected to a bit line 226. Only a portion of the memory cell array is shown in FIG. 2.

Each of the word lines 220, 222, 224 is driven by a word line driver of the X decoder 122. Each word line driver includes transistors for selecting and deselecting the respective word line. Thus, the first word line 220 is driven by a first word line driver 230 having a first transistor 232 and a second transistor 234. The second word line 222 is driven by a second word line driver 236 having a first transistor 238 and a second transistor 240. The third word line 224 is driven by a third word line driver 242 having a first transistor 244 and a second transistor 246. The gates of these respective transistors are coupled to other circuitry of the X decoder 122 so that each word line may be uniquely decoded and selected in response to address data received at the address input/output pads of the integrated circuit 100.

In accordance with the illustrated embodiment, the source of one transistor of each word line driver is coupled to the first logic circuitry 204 at node 205. Thus, the source of transistor 234, the source of transistor 240 and the source of transistor 246 are all commonly coupled to the first logic circuitry 204. Transistor 234, transistor 240 and transistor 246 act as low-resistance pass gates to convey the voltage on node 205 to the word lines 220, 222, 224.

The first logic circuitry 204 is coupled to a first external connection, such as I/O pad 202, and word lines 220, 222, 224 of the memory cell array 102. The first logic circuitry 204 is configurable in one of a normal mode and a test mode in response to a first control signal from the control logic 206. The first logic circuitry conveys a variable voltage from the I/O pad 202 to the array of memory cells. The first logic circuitry 204 may be any suitable logic circuitry on the integrated circuit 100. In accordance with the present embodiment, the first logic circuitry 204 operates in one of a normal mode and a test mode. The mode of operation is selected by a signal received from the control logic 206. The first logic circuitry may be, for example, a portion of the address decoder 104 (FIG. 1). In normal mode, the logic circuitry operates in a conventional manner. If the first logic circuitry 204 is a part of the address decoder 104, the first logic circuitry operates to decode address data received at the address inputs of the integrated circuit 100.

In the test mode, when the necessary control signals are applied, the first logic circuitry 204 is disabled from performing its normal function and a path is formed from the I/O pad 202 to the X decoder 122. In this manner, a test voltage applied at the I/O pad 202 is conveyed through the first logic circuitry 204 to the X decoder 122. The transistors of the respective word line drivers further convey the test voltage to each of the word lines 220, 222, 224. Preferably, the path through the first logic circuitry 204 and the word line drivers 230, 236, 242 is composed of pass gates which convey the voltage from the I/O pad 202 to each respective word line with substantially zero voltage drop.

The control logic 206 selects the test mode and provides a first control signal to the first logic circuitry 204 and the second logic circuitry 208. The control logic 206 receives a test mode signal to generate the necessary control signals. The test mode signal may be provided in any suitable manner, such as applying appropriate voltages to input pads of the integrated circuit 100 to place the integrated circuit 100 in the test mode.

The second logic circuitry 208 is coupled between bit lines of the array of memory cells, such as the bit line 226, and a second external connection, such as the second I/O pad 210. The second logic circuitry 208 is operable in a normal mode and a test mode in response to a second control signal received from the control logic 206.

The second logic circuitry provides a current from the memory cell array 102 in response to the second control signal. When a memory cell is selected on the bit line 226, the memory cell draws a current. Ideally, the unselected cells on the same bit line draw no current. This is because the gate to source voltage of the unselected cells is below the threshold voltage of the transistors in the cells. The threshold voltage is nominally 0.6 to 0.8 V. Typically some leakage or subthreshold current does flow in the unselected memory cells. Operating the memory device in the test mode allows this subthreshold current to be characterized by detecting it at the second I/O pad 210.

In normal mode, the current in the bit line 226 is a current on the order of a few tens of microamps. In the test mode, the current is the sum of the currents in each of the memory cells on the bit line 226. This current flows in response to the test voltage applied to the word lines through the first I/O circuitry 204. In normal mode, the current is conveyed by the second logic circuitry 208 to sense amplifiers 250. The value of the current is detected by the sense amplifier 250 which makes a decision about the data stored in the selected memory cell. In the test mode, in response to a control signal received from the control logic 206, the current in the bit line 226 is steered by the second logic circuitry 208 to the second I/O pad 210. This current can be detected to test the level of subthreshold current in the memory cell array.

In one embodiment, a method for testing the integrated circuit 100 includes steps of placing the integrated circuit in a test mode by applying a test signal to the control logic 206. A variable voltage is applied to the first I/O pad 202. Preferably, the I/O voltage is swept from approximately 0 V to 1 V. With the integrated circuit in the test mode, the first logic circuitry 204 is configured to pass the variable voltage from the first I/O pad 202 to the X decoder 122, electrically coupling the first I/O pad 202 with one or more word lines of the memory cell. In the illustrated embodiment, the variable voltage is applied to all of the word lines 220, 222, 224. As the voltage is swept from approximately 0–1 volts, initially almost all of the memory cell transistors will be turned off. As the voltage increases, some of the memory cell transistors having relatively low threshold voltages will begin to turn on. As the variable voltage reaches approximately 1V, substantially all of the memory cell transistors on the bit line will be turned on. By varying the voltage in this manner, the bit line current can be sensed and characterized.

Figure 3:
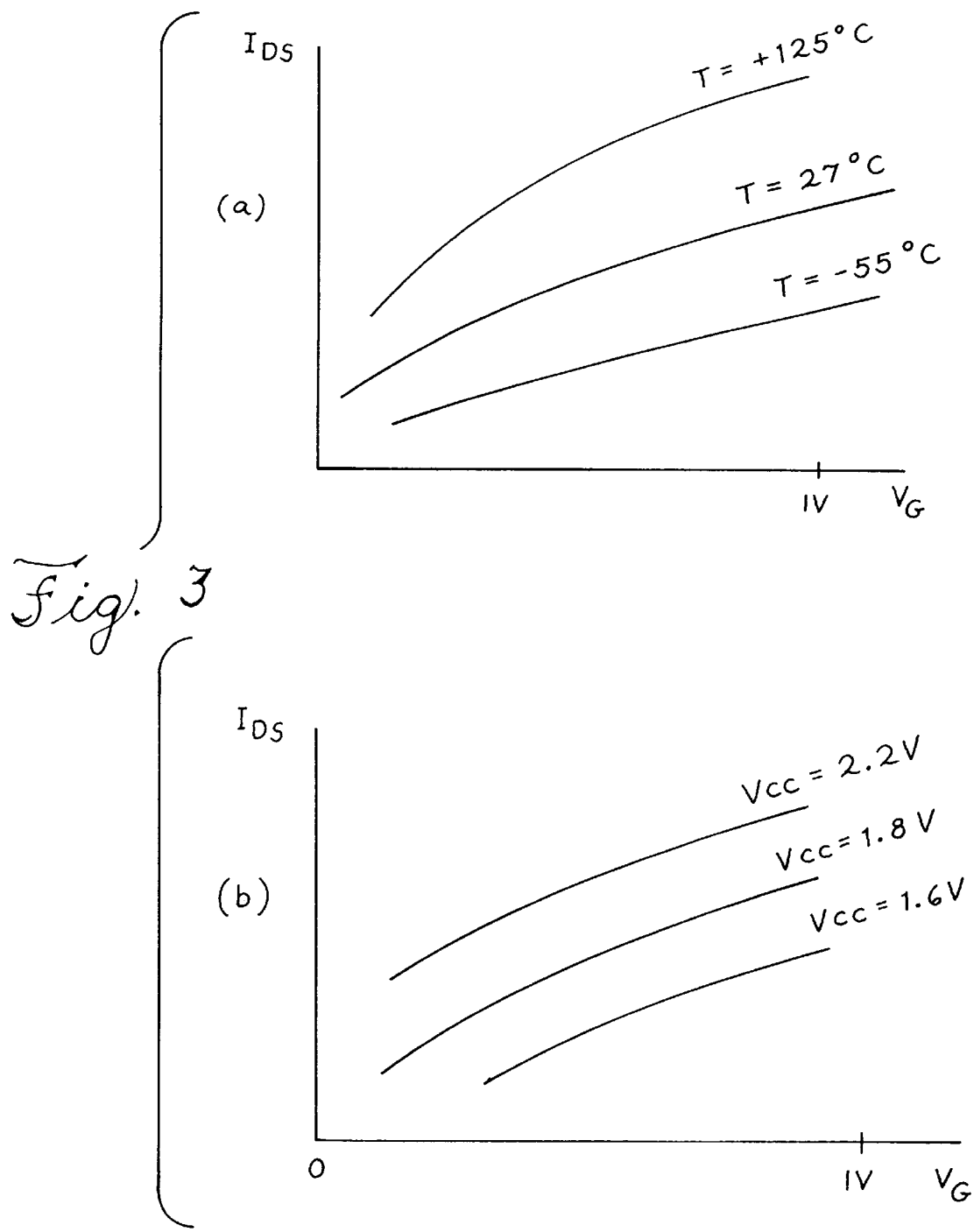
FIG. 3 illustrates test data for the integrated circuit of FIG. 1.

FIG. 3 illustrates test data developed for the integrated circuit 100 of FIG. 1. In FIG. 3, values of bit line current IDS are plotted against the applied voltage $V_G$. The values for $I_{DS}$ were obtained by setting the value of the voltage $V_G$ and measuring the subthreshold current produced as a result. In addition, one or more operating parameters of the integrated circuit 100 can be varied while measuring the bit line current at the second I/O pad 210. For example, the temperature of the integrated circuit can be varied. FIG. 3(a) illustrates the family of curves that results for different operating temperatures of the integrated circuit 100. Similarly, the operating voltage, $V_{cc}$, of the integrated circuit can be varied. FIG. 3(b) illustrates the family of curves that results for different supply voltages for the integrated circuit 100. The resulting series of curves more completely characterize the operation and performance of the integrated circuit 100.

From the foregoing, it can be seen that the present invention provides an improved method and apparatus for testing the operation of a memory cell array in an integrated circuit. By placing the integrated circuit in a test mode, measurements are taken directly on the actual memory device, rather than on test structures located on test chips.

The voltage applied to the memory cells can be varied directly using external connections. Individual bit line currents can be sensed also using external connections. This allows characterization of bit lines having very long write and erase times to identify problems in design or manufacture. Further, a column leakage current distribution can be generated for any bias condition and any temperature using the illustrated embodiment. The data collected in the test mode can be used to improve the design of the integrated circuit and portions thereof.

While a particular embodiment of the present invention has been shown and described, modifications may be made. For example, rather than using bonding pads or input/output pads located at the peripheiy of the integrated circuit for applying the test voltage and measuring bit line current, separate probe points may be established in the metallization of the integrated circuit for convenient access to the necessary nodes of the circuit. In is therefore intended in the appended claims to cover all such changes and modifications which fall within the true spirit and scope of the invention.

What is claimed is:

1. A method for testing an integrated circuit including an array of memory cells, the method comprising:
   placing the integrated circuit in a test mode;
   applying a variable voltage to a first input/output (I/O) pad of the integrated circuit;
   in response to the test mode, electrically coupling the first I/O pad with one or more word lines of the array of memory cells;
   in response to the test mode, coupling one or more bit lines of the array to a second I/O pad of the integrated circuit; and
   measuring subthreshold current due to the variable voltage in memory cells of the array of memory cells at the second I/O pad of the integrated circuit.

2. The method of claim 1 wherein measuring the subthreshold current of the integrated circuit comprises measuring subthreshold current of all memory cells on a single bit line in the array of memory cells.

3. The method of claim 1 further comprising the step of:
   varying one or more operating parameters of the integrated circuit while measuring the subthreshold current.

4. The method of claim 3 wherein varying one or more operating parameters comprises varying temperature of the integrated circuit.

5. The method of claim 3 wherein varying one or more operating parameters comprises varying operating voltage of the integrated circuit.

6. The method of claim 1 further comprising the steps of generating control signals to reconfigure logic circuitry from normal mode to the test mode.

7. An integrated circuit comprising:
   an array of memory cells, each memory cell coupled to a word line and a bit line;
   a first external connection configured to receive a variable voltage;
   first logic circuitry coupled to the first external connection and one or more word lines of the array of memory cells and configurable in one of a normal mode and a test mode in response to a first control signal, the first logic circuitry conveying the variable voltage to the array of memory cells in the test mode;
   a second external connection configured to provide subthreshold current in one or more memory cells responsive to the received variable voltage of the integrated circuit;

second logic circuitry coupled between bit lines of the array of memory cells and the second external connection and operable in a normal mode and a test mode in response to a second control signal, the second logic circuitry providing the subthreshold current in the one or more memory cells from the array of memory cells in response to the second control signal; and a control circuit for selecting the test mode and providing the first control signal and the second control signal.

8. The integrated circuit of claim 7 wherein the first logic circuitry is coupled to a plurality of word lines of the array of memory cells.

9. The integrated circuit of claim 8 wherein the first logic circuit is configured to couple the first external connection to the plurality of word lines of the memory cells to convey the variable voltage to the word lines in the test mode and to decouple the first external connection from the plurality of word lines in the normal mode.

10. The integrated circuit of claim 9 wherein the second logic circuitry comprises a circuit configured to provide a current from all memory cells coupled to the bit line of the array in the test mode.

11. The integrated circuit of claim 7 wherein the first external connection and the second external connection comprise bonding pads of the integrated circuit.

12. A method for measuring subthreshold current in a memory cell array of an integrated circuit, the method comprising the steps of:

entering a test mode;

in response to the test mode, reconfiguring first circuitry of the integrated circuit to couple a first input/output (I/O) pad to word lines of the memory cell array;

in response to the test mode, reconfiguring second circuitry of the integrated circuit to couple a second I/O pad to a bit line of the memory cell array;

providing a variable voltage at the first I/O pad; and detecting the subthreshold current responsive to the variable voltage in the bit line at the second I/O pad.

13. The method of claim 12 further comprising steps of:

decoding bit lines of the memory cell array to couple the second I/O pad to a decoded bit line;

providing the subthreshold current of the decoded bit line to the second I/O pad; and decoding the bit lines to couple the second I/O pad to a next decoded bit line.

14. The method of claim 12 further comprising steps of:

varying one or more operating parameters of the integrated circuit; and detecting the current from the bit line as the one or more operating parameters are varied.

15. The method of claim 14 wherein varying one or more operating parameters comprises at least one of the steps of:

varying the temperature of the integrated circuit; and varying the operating voltage of the integrated circuit.

* * * * *